United States Patent [19]

Minakuchi

[11] 4,081,698

[45] Mar. 28, 1978

[54] STEP-TO-IMPULSE CONVERSION CIRCUIT

[75] Inventor: Hiroshi Minakuchi, Shiga, Japan

[73] Assignee: Matsushita Electric Industrial Co., Ltd., Osaka, Japan

[21] Appl. No.: 717,275

[22] Filed: Aug. 24, 1976

[51] Int. Cl.² .......................... H03K 5/04; H03K 4/00
[52] U.S. Cl. .................................... 307/261; 307/266; 307/273; 307/288; 307/313; 307/300
[58] Field of Search ............... 307/260, 261, 266, 268, 307/273, 279, 288, 300, 313

[56] References Cited

U.S. PATENT DOCUMENTS

| | | |
|---|---|---|
| 3,735,154 | 5/1973 | Meeker et al. ................... 307/273 |
| 3,824,408 | 7/1974 | Brunel ............................ 307/300 X |

*Primary Examiner*—John Zazworsky
*Attorney, Agent, or Firm*—Burgess, Ryan and Wayne

[57] ABSTRACT

A step-to-impulse conversion circuit for converting a step input into an impulse output is disclosed which may eliminate the use of capacitors and comprises a combination of four transistors or three transistors, one thyristor and one diode with resistors so that the fabrication of monolithic integrated circuits may be much facilitated.

5 Claims, 3 Drawing Figures

STEP-TO-IMPULSE CONVERSION CIRCUIT

BACKGROUND OF THE INVENTION

The present invention relates to a transistorized step-to-impulse conversion circuit.

A differentiating circuit consisting of a resistor and a capacitor has been long used for converting a step waveform into an impulse waveform. However it is extremely difficult to produce by the present semiconductor technology the monolithic integrated circuits including capacitors with a high capacitance so that the integrated circuits including a differentiating circuit must be connected to an outside capacitor and consequently a desired miniaturization cannot be achieved.

To overcome these problems, there has been invented and demonstrated a method for producing impulses by utilizing the delay in transmission of the signal in a plurality of stages of amplifiers, but this method has inherent limitations in that the circuit is very complex in construction and requires a large power. There has been also invented and demonstrated an impulse generator utilizing excess minority-carrier charge in transistors, but in this type impulse generator it is difficult to fabricate the integrated impulse generator circuits, resistors having a high value are required and the operation is often adversely affected by noise.

SUMMARY OF THE INVENTION

In view of the above, one of the objects of the present invention is to provide a step-to-impulse conversion circuit which is very simple in construction.

Another object of the present invention is to provide a step-to-impulse conversion circuit in which when the input is zero no current flows through any of the circuit components so that the power consumption may be minimized.

A further object of the present invention is to provide a step-to-impulse conversion circuit which is immune to noise.

A further object of the present invention is to provide a step-to-impulse conversion circuit which may eliminate the use of capacitors so that the design and fabrication of monolithic integrated circuits may be much facilitated.

Briefly stated, to the above and other ends the present invention provides a step-to-impulse conversion circuit comprising a first transistor with the base connected to an input terminal, a second transistor to which is applied the signal from the emitter of said first transistor, a third transistor to which is applied the signal from the collector of said first transistor, a switching element responsive to the output signal from said third transistor for bypassing the emitter current from said first transistor, and an output terminal connected to said second transistor.

BRIEF DESCRIPTION OF THE DRAWINGS

Same reference numerals are used to designate similar parts throughout the figures.

DESCRIPTION OF THE PREFERRED EMBODIMENTS

Figure 1:
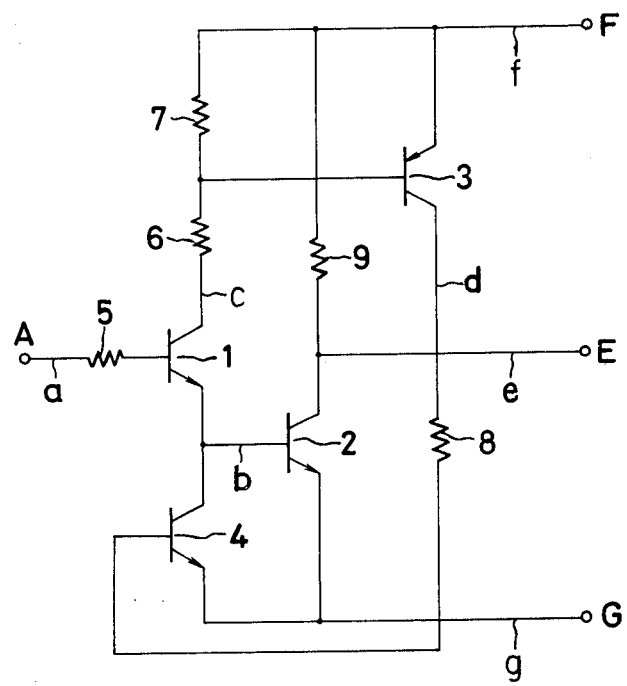
FIG. 1 is a diagram of a first embodiment of a step-to-impulse conversion circuit in accordance with the present invention.

In FIG. 1 there is shown a circuit diagram of a first embodiment of the present invention. A signal input terminal A is connected through a resistor 5 to the base of a transistor 1. The emitter of the transistor 1 is connected to the base of a transistor 2 while the collector of the transistor 1 is connected through resistors 6 and 7 to a positive bus line f. The junction between the resistors 6 and 7 is connected to the base of a transistor 3 with the emitter connected to the positive bus line f. The collector of the transistor 3 is connected through resistor 8 to the base of a transistor 4 whose emitter is connected to a negative bus line g and whose collector is connected to the base of a transistor 2. The emitter of the transistor 2 is connected to the negative bus line g while the collector is connected not only to a signal output terminal E but to the positive bus line f through a resistor 9. Terminals F and G are connected to positive and negative terminals, respectively, of a power supply.

Under the conditions that a DC voltage is impressed across the feed terminals F and G and that the potential at the terminal A is zero, all of the transistors 1, 2, 3, and 4 are OFF so that the potential at the terminal E equals the voltage of the power supply; that is, the voltage of the positive bus line f.

Figure 2:
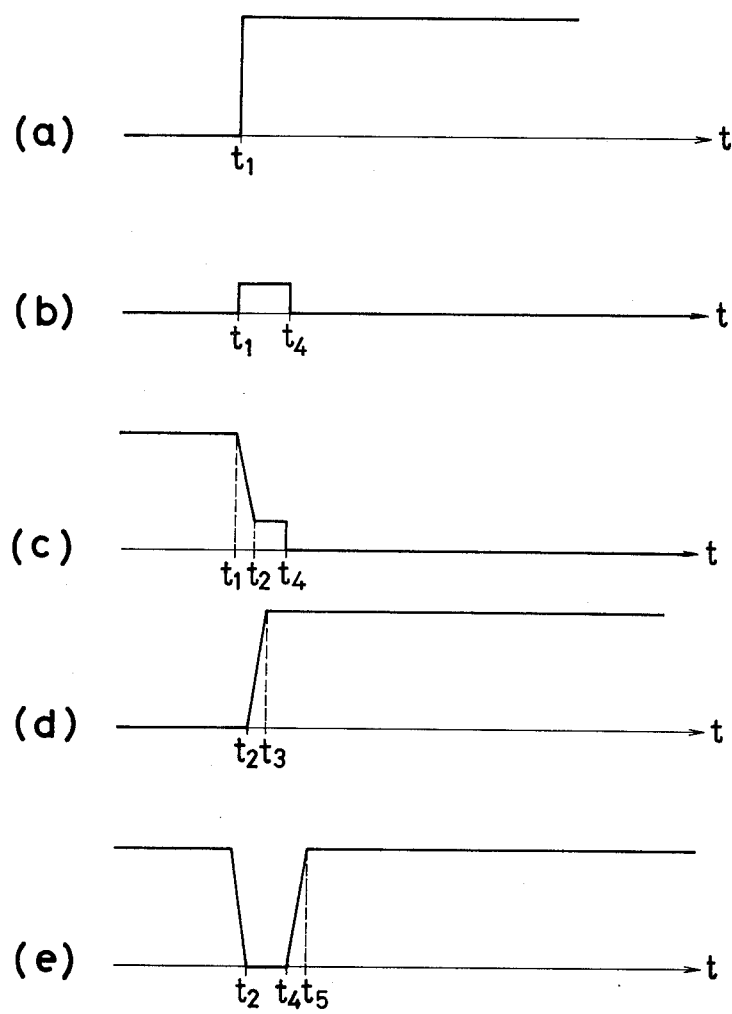
FIG. 2 is a diagram used for the explanation of the mode of operation thereof.

When the potential at the input terminal A rises momentarily at $t_1$ as shown in FIG. 2(a), the base current flows into the transistors 1 and 2, and at $t_2$ the collector current starts to flow. Part of the collector current of the transistor 1 becomes the base current of the transistor 3, and at $t_3$ the collector current of the transistor 3 flows. At $t_4$ the collector current flows into the transistor 4 to saturate it so that the collector-to-emitter voltage becomes substantially zero and consequently the emitter current from the transistor 1 flows into the collector of the transistor 4 instead of the base of the transistor 2.

Therefore at $t_5$ the collector current of the transistor 2 becomes zero after the minority carriers in the base region of the transistor 2 have disappeared.

The waveforms of the signals at a, b, c, d and e in FIG. 1 are shown in FIGS. 2(a), (b), (c), (d) and (e), respectively.

In practice the first embodiment may comprise transistor 1, 2SC828,
transistor 2, 2SC828,
transistor 3, 2SA564,
transistor 4, 2SC828,
resistor 5, 10 KΩ
resistor 6, 5 KΩ
resistor 7, 5 KΩ
resistor 8, 10 KΩ and
resistor 9, 5 KΩ.

The time interval from $t_2$ to $t_5$ is, in general, of the order of a few microseconds, and the higher the current gains of the transistors 2, 3 and 4 or the lower the cutoff frequency of these transistors, the longer the time interval from $t_2$ to $t_5$ becomes. This time interval may be also varied by changing the base current of each transistor.

From FIG. 2(e) it is seen that the step input signal is converted into the negative-going impulse (which may be not regarded as an impulse in the strict mathematical sense because it has a width of a few microseconds, but may be treated as an impulse when the signals to be handled are relatively low in frequency).

The positive-going impulse may be derived from the emitter of the transistor 2 or an inverter connected to the output terminal E.

Figure 3:
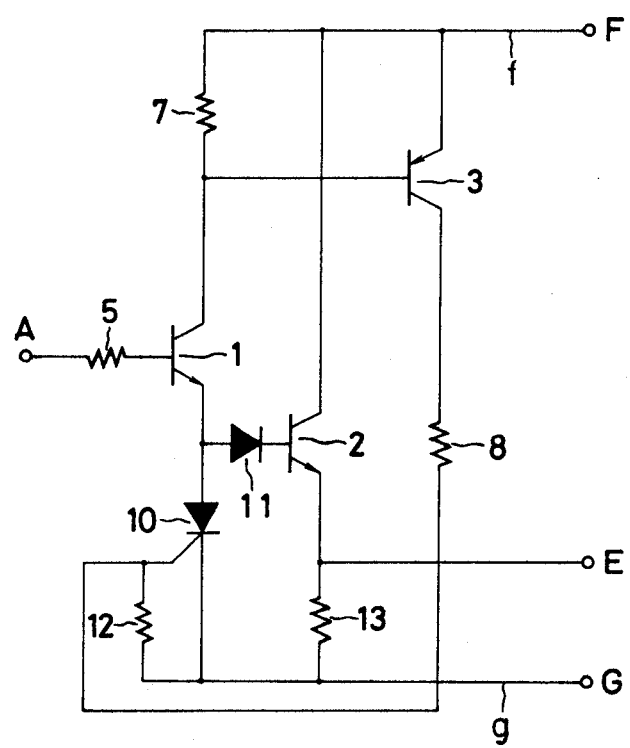
FIG. 3 is a circuit diagram of a second embodiment.

In FIG. 3 there is shown a circuit diagram of the second embodiment of the present invention, wherein the emitter of the transistor 1 is connected with the negative bus line g through a thyristor 10 instead of the transistor 4 in the first embodiment, the emitter of the transistor 2 is connected through a resistor 13 to the negative bus line, and the output terminal E is connected to the emitter of the transistor 2. A resistor 12 is connected between the gate and cathode of the thyristor 10 in order to stabilize the operation of the thyristor 10, and in order to compensate a higher ON voltage of the thyristor 10 than an ON voltage of the transistor, a diode 11 is connected between the emitter of the transistor 1 and the base of the transistor 2.

The mode of operation of the second embodiment is substantially similar to that of the first embodiment except that the positive-going impulse is obtained because the output terminal E is connected to the emitter of the transistor 2.

As described above, the step-impulse conversion circuit in accordance with the present invention comprises a first transistor with the base connected to an input terminal, a second transistor to which is applied the signal from the emitter of the first transistor, a third transistor to which is applied the signal from the collector of the first transistor, a switching element such as a fourth transistor or a thyristor for bypassing the emitter current from the first transistor in response to the output signal from the third transistor, and the output signal being derived from the second transistor.

What is claimed is:

1. A step-to-impulse conversion circuit utilizing only non-reactive elements, comprising:

first, second and third transistors each having a control electrode, a first main electrode the potential of which varies directly in accordance with the potential of said control electrode, and a second main electrode the potential of which varies inversely in accordance with the potential of said control electrode, each transistor being biased for operation in a switching mode;

an input terminal coupled to the control electrode of the first transistor;

an output terminal coupled to the second main electrode of said second transistor;

the first main electrode of the first transistor being coupled to the control electrode of the second transistor and the second main electrode of the first transistor being coupled to the control electrode of the third transistor;

the first main electrodes of the second and third transistors being coupled to respective power supply terminals;

a switching element coupled between the control electrode of said second transistor and the power supply terminal to which said first main electrode of said second transistor is coupled, said switching element having a control terminal coupled to the second main electrode of said third transistor.

2. A step-to-impulse conversion circuit as set forth in claim 1 wherein
said switching element comprises a switching transistor.

3. The circuit according to claim 1, wherein said transistors are all bipolar, said control electrode, first main electrode and second main electrode corresponding to base, emitter and collector electrodes respectively.

4. A step-to-impulse conversion circuit as set forth in claim 3 wherein
said switching element comprises a thyristor.

5. A step-to-impulse conversion circuit as set forth in claim 4 wherein
the emitter of said first transistor is connected through a diode to the base of said second transistor.

* * * * *